United States Patent
Cui

(10) Patent No.: US 10,200,042 B2
(45) Date of Patent: Feb. 5, 2019

(54) IO INTERFACE LEVEL SHIFT CIRCUIT, IO INTERFACE LEVEL SHIFT METHOD AND STORAGE MEDIUM

(71) Applicant: SANECHIPS TECHNOLOGY CO., LTD., Nanshan District, Shenzhen, Guangdong (CN)

(72) Inventor: Hailiang Cui, Shenzhen (CN)

(73) Assignee: Sanechips Technology Co. Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/519,241

(22) PCT Filed: Apr. 14, 2015

(86) PCT No.: PCT/CN2015/076527
§ 371 (c)(1),
(2) Date: Apr. 14, 2017

(87) PCT Pub. No.: WO2016/058343
PCT Pub. Date: Apr. 21, 2016

(65) Prior Publication Data
US 2017/0222650 A1 Aug. 3, 2017

(30) Foreign Application Priority Data
Oct. 16, 2014 (CN) .......................... 2014 1 0549552

(51) Int. Cl.
*H03K 19/0185* (2006.01)
*H03K 19/0175* (2006.01)
*H03K 3/356* (2006.01)

(52) U.S. Cl.
CPC . *H03K 19/018521* (2013.01); *H03K 19/0175* (2013.01); *H03K 3/356104* (2013.01)

(58) Field of Classification Search
CPC ............................................. H03K 19/018521
See application file for complete search history.

(56) References Cited

U.S. PATENT DOCUMENTS

2004/0090262 A1* 5/2004 Nam .......................... G05F 1/46
327/538
2006/0071686 A1 4/2006 Chang
(Continued)

FOREIGN PATENT DOCUMENTS

CN 101202723 A 6/2008
CN 101719764 A 6/2010
(Continued)

OTHER PUBLICATIONS

International Search Report in international application No. PCT/CN2015/076527, dated Jul. 8, 2015, 2 pgs.
(Continued)

*Primary Examiner* — Daniel Puentes
(74) *Attorney, Agent, or Firm* — Cooper Legal Group, LLC

(57) ABSTRACT

Provided is an IO interface level shift circuit, comprising: an intermediate level generation circuit (11) and a level shift circuit (12). The intermediate level generation circuit is configured to provide an intermediate level Vdd_io of an IO interface. The level shift circuit is configured to convert an external logical signal into a signal in an internal power domain of a chip according to the intermediate level Vdd_io of the IO interface. Also provided are an IO interface level shift method and a storage medium. The interface level shift circuit enables level shift on an external IO signal at any level in a voltage withstanding domain of a device without adding a power domain suitable for an external IO level in the circuit.

9 Claims, 2 Drawing Sheets

(56) References Cited

U.S. PATENT DOCUMENTS

| | | | |
|---|---|---|---|
| 2008/0048719 A1 | 2/2008 | Ogawa | |
| 2011/0006809 A1* | 1/2011 | Takenaka | H03K 3/35613 326/80 |
| 2014/0009201 A1* | 1/2014 | Wang | H03K 19/01851 327/333 |

FOREIGN PATENT DOCUMENTS

| | | |
|---|---|---|
| CN | 102957415 A | 3/2013 |
| CN | 102591401 B | 10/2013 |
| CN | 103532538 A | 1/2014 |
| CN | 103888126 A | 6/2014 |
| JP | H02224508 A | 9/1990 |
| JP | 2001068976 A | 3/2001 |
| JP | 2004363843 A | 12/2004 |
| JP | 2007116334 A | 5/2007 |
| JP | 2007116344 A | 5/2007 |
| JP | 2010028867 A | 2/2010 |
| JP | 2010146423 A | 7/2010 |
| JP | 2011019017 A | 1/2011 |
| JP | 2011211444 A | 10/2011 |
| JP | 2013110584 A | 6/2013 |

OTHER PUBLICATIONS

English Translation of the Written Opinion of the International Search Authority in international application No. PCT/CN2015/076527, dated Jul. 8, 2015, 7 pgs.
Supplementary European Search Report in European application No. 15851031.3, dated Sep. 12, 2017, 7 pgs.

\* cited by examiner

IO INTERFACE LEVEL SHIFT CIRCUIT, IO INTERFACE LEVEL SHIFT METHOD AND STORAGE MEDIUM

TECHNICAL FIELD

The disclosure relates to a power management technology, and in particular to a level shift circuit for an IO interface, a level shift method for an IO interface and a storage medium.

BACKGROUND

As the application range of chips widens continuously, a chip needs to communicate with an external Host in real time so as to receive an instruction from the Host to perform a corresponding action, which requires the chip to be provided with an IO interface circuit to transmit the instruction of the external Host to the inside of the chip or feedback the execution result of the chip back to the external Host. Thus, the IO interface circuit should address problems existing in signal level shift and signal driving. Existing IO interface circuits perform a level shift by introducing the interface level of the external Host of a chip to the inside of the chip for a level shift with an internal power supply of the chip or by generating an external interface power supply inside the IO interface circuits using a Low Dropout Regulator (LDO).

In a case where the interface level of the Host of a chip is introduced to the inside of the chip for a level shift with an internal power supply of the chip, a specific pin for introducing an IO interface level is needed, which will absolutely result in addition of a pin on a chip and consequentially increase the cost of the chip in processes such as banding, encapsulation and so on and degrade the competitiveness of the chip; and in a case where a level shift is realized by generating an external interface power supply through an internal LDO, it is needed to generate the reference voltage and the reference current of the LDO at the same time, which makes it more difficult to realize a chip, increases the standby power consumption of the chip and narrows the application range of the chip.

SUMMARY

In view of this, embodiments of the disclosure are intended to provide a level shift circuit for an IO interface, a level shift method for an IO interface and a storage medium, which are capable of addressing the problems of high cost, difficult realization, high power consumption and small application range existing in the conventional art.

To achieve the purposes above, the solutions of the disclosure are as follows:

a level shift circuit for an IO interface is provided in an embodiment of the disclosure, including: an intermediate level generation sub-circuit and a level shift sub-circuit, the intermediate level generation sub-circuit is arranged to provide the intermediate level Vdd_io of the IO interface; and the level shift sub-circuit is arranged to convert an external logic signal into a signal of an internal power domain of a chip according to the intermediate level Vdd_io of the IO interface.

In the solution, the intermediate level generation sub-circuit includes: a current mirror unit and an intermediate level generation unit, the current mirror unit is arranged to provide a bias current for the intermediate level generation unit according to a sink current; and the intermediate level generation unit is arranged to provide, under the effect of the bias current, the intermediate level Vdd_io of the IO interface.

In the solution, the current mirror unit includes a transistor PM1 and a transistor PM2, herein the gate and the drain of the transistor PM1 are connected with the gate of the transistor PM2 to form a current mirror; and the intermediate level generation unit includes a transistor PM0, a transistor NM0, a transistor NM1, a transistor NM3 and a transistor NM4, herein the transistor PM0, the transistor NM0, the transistor NM3 and the transistor NM4, which are diode-connected, are arranged to cause the output intermediate level Vdd_io of the IO interface to be equal to the sum of a gate-to-source voltage of the transistor NM0 and a gate-to-source voltage of the transistor PM0.

In the solution, the transistor NM1 which provides a bias current for the transistor NM4 is arranged to avoid the output intermediate level Vdd_io of the IO interface to be high when empty load of a succeeding stage causes the gate-to-source voltage of the transistor NM4 to be 0.

In the solution, each of the transistor NM0 to the transistor NM4 is an NMOS transistor, each of the transistor PM0 to the transistor PM2 is a PMOS transistor, alternatively, each of the transistor NM0 to the transistor NM2 is an NMOS transistor, the transistor PM0 is a PMOS transistor, and each of the transistor PM1, the transistor PM2, the transistor NM3 and the transistor NM4 is a high voltage resisting DEMOS transistor.

In the solution, the intermediate level generation sub-circuit further includes: an output filter capacitor arranged to stabilize the output voltage of the intermediate level generation sub-circuit.

In the solution, the source of the transistor PM1 is connected with an internal power supply VDD of a chip, and the gate and the drain of the transistor PM1 are shorted together and connected with the gate of the transistor PM2 and the sink current I0;

the source of the transistor PM2 is connected with the internal power supply VDD of the chip, the drain of the transistor PM2 is connected with the drain and the gate of the transistor NM3 and the gate of the transistor NM4;

the source of the transistor NM3 is connected with the source of a PMOS transistor PM0;

the gate and the drain of the transistor PM0 and the gate and the drain of the transistor NM0 are connected with the gate of the transistor NM1;

the source of the transistor NM0 is connected with the ground potential;

the source of the transistor NM1 is connected with the ground potential, the drain of the transistor NM1 is connected with the source of the transistor NM4 and the anode of the output filter capacitor to function as the output electrode of a circuit; and the drain of the transistor NM4 is connected with the internal power supply VDD of the chip.

A level shift method for an IO interface is also provided, including:

providing the intermediate level Vdd_io of the IO interface through an intermediate level generation sub-circuit; and converting, using a level shift sub-circuit, an external logic signal into a signal of an internal power domain of a chip according to the intermediate level Vdd_io of the IO interface.

In the solution, providing the intermediate level Vdd_io of the IO interface through an intermediate level generation sub-circuit includes: providing a bias current for an intermediate level generation unit through a current mirror unit according to a sink current; and providing the intermediate level Vdd_io of the IO interface through the intermediate level generation unit.

In the solution, providing the intermediate level Vdd_io of the IO interface through the intermediate level generation unit includes: diode-connecting a transistor PM0, a transistor NM0, a transistor NM3 and a transistor NM4 to cause the output intermediate level Vdd_io of the IO interface to be equal to the sum of a gate-to-source voltage of the transistor NM0 and a gate-to-source voltage of the transistor PM0.

The method further includes: providing a bias current for the transistor NM4 through the transistor NM1 to avoid the output intermediate level Vdd_io of the IO interface to be high when empty load of a succeeding stage causes the gate-to-source voltage of the transistor NM4 to be 0; and stabilizing the output voltage of the intermediate level generation sub-circuit through an output filter capacitor.

A computer storage medium is also provided in an embodiment of the disclosure, herein the computer storage medium stores computer-executable instructions that are used to execute the level shift method for an IO interface provided in embodiments of the disclosure.

The level shift circuit for an IO interface provided herein includes an intermediate level generation sub-circuit and a level shift sub-circuit, herein the intermediate level generation sub-circuit is arranged to provide the intermediate level Vdd_io of the IO interface; and the level shift sub-circuit is arranged to convert an external logic signal into a signal of an internal power domain of a chip according to the intermediate level Vdd_io of the IO interface. In this way, a level shift can be performed on the external IO signal of any level in a withstand voltage domain of a device without arranging a power domain suitable for an external IO level inside a circuit, thus realizing the level shift and the signal driving of an interface circuit; moreover, the level shift circuit for an IO interface provided in embodiments of the disclosure can be integrated with a power management chip having a strict requirement on power consumption to meet the low power consumption requirement of the power management chip; the level shift circuit for an IO interface provided herein can be compatible with the mainstream BCD technology in the absence of an additional mask plate and an additional power generation sub-circuit such as LDO, thus, the cost of a chip is reduced. Thus, the problems of existing chips including high cost, difficult realization, high power consumption and small application range are solved.

DETAILED DESCRIPTION

Figure 1:
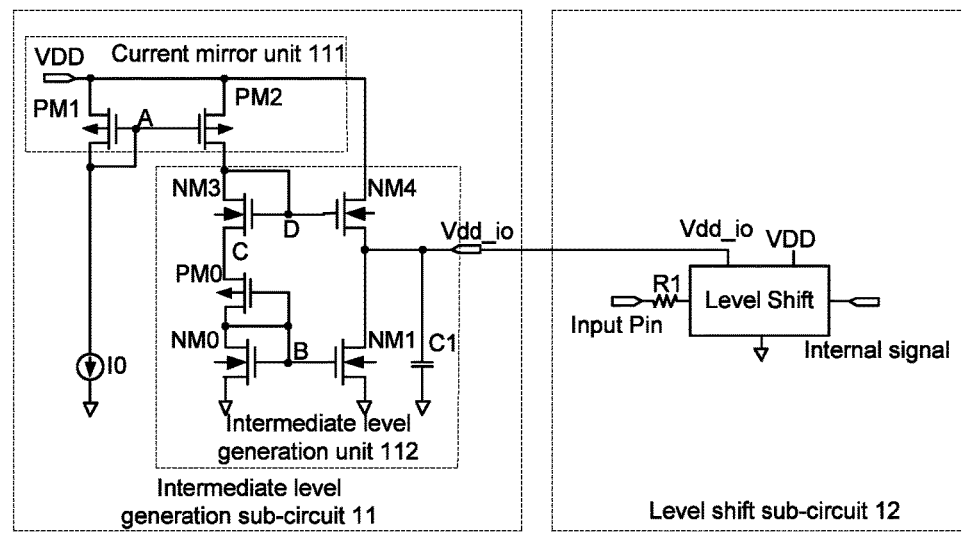
FIG. 1 is a schematic diagram illustrating the structure of a level shift circuit for an IO interface according to an embodiment of the disclosure.

The level shift circuit for an IO interface provided herein includes an intermediate level generation sub-circuit and a level shift sub-circuit, herein the intermediate level generation sub-circuit is arranged to provide the intermediate level Vdd_io of the IO interface; and the level shift sub-circuit is arranged to convert an external logic signal into a signal of an internal power domain of a chip according to the intermediate level Vdd_io of the IO interface The intermediate level generation sub-circuit includes: a current mirror unit and an intermediate level generation unit, herein the current mirror unit is arranged to provide a bias current for the intermediate level generation unit according to a sink current; and the intermediate level generation unit is arranged to provide, under the effect of the bias current, the intermediate level Vdd_io of the IO interface.

In an embodiment, the current mirror unit includes a transistor PM1 and a transistor PM2, herein the grid and the drain of the transistor PM1 are connected with the gate of the transistor PM2 to form a current mirror.

The current mirror is a mirror current source; when the input end of the current mirror inputs a reference current, the output end of the current mirror outputs an output current which is identical in magnitude and direction to the reference current, in this way, the current of an input branch is copied into an output branch to provide a current for another subsystem. The principle of current mirror is that the channel currents of two identical MOSs are equal if the gate-to-source voltages of the two MOSs are equal. For example, in embodiments of the disclosure, the current of the input branch is a sink current I0, the current at the side of the output branch is the drain current of the transistor PM2, and the another subsystem is the intermediate level generation unit; the potential of the source of the transistor PM1 is equal to the potential of the source of the transistor PM2, both being VDD; the gate of the transistor PM1 is equal to that of the transistor PM2 in potential, that is, the gate-to-source voltage of the transistor PM1 is equal to that of the transistor PM2, thus, the drain current of the transistor PM1 is equal to that of the transistor PM2 if the transistor PM1 is completely identical to the transistor PM2 in attribute; and the output current of the current mirror unit is equal to the product of K and an input current if attributes of the transistor PM1 are different from those of the transistor PM2, herein K is determined by attributes of the transistor PM1 and the transistor PM2. In this way, the current of the input branch is copied into the output branch.

The intermediate level generation unit includes a transistor PM0, a transistor NM0, a transistor NM1, a transistor NM3 and a transistor NM4, herein the transistor PM0, the transistor NM0, the transistor NM3 and the transistor NM4, which are diode-connected, are arranged to cause the output intermediate level Vdd_io of the IO interface to be equal to the sum of a gate-to-source voltage of the transistor NM0 and a gate-to-source voltage of the transistor PM0.

The transistor NM1 which provides a bias current for the transistor NM4 is arranged to avoid the output intermediate level Vdd_io of the IO interface to be high when empty load of a succeeding stage causes the gate-to-source voltage of the transistor NM4 to be 0.

In embodiments of the disclosure, the transistor NM0 and the transistor NM1 form a current mirror structure to input a current which is K times the magnitude of the drain current of the transistor NM0 to the source of the transistor NM4, here, K is determined by attributes of the transistor NM0 and the transistor NM1, and when the transistor NM0 is completely identical to the transistor NM1 in attribute, K is 1, so as to avoid the output intermediate level Vdd_io of the IO interface to be high when empty load of a succeeding stage causes the gate-to-source voltage of the transistor NM4 to be 0.

In embodiments of the disclosure, each of the transistor NM0 to the transistor NM4 is an NMOS transistor, each of the transistor PM0 to the transistor PM2 is a PMOS transistor; or, each of the transistor NM0 to the transistor NM2 is an NMOS transistor, the transistor PM0 is a PMOS transistor, and each of the transistor PM1, the transistor PM2, the transistor NM3 and the transistor NM4 is a high voltage resisting DEMOS transistor.

The intermediate level generation sub-circuit further includes an output filter capacitor arranged to stabilize the output voltage of the level shift circuit for an IO interface, that is, the intermediate level Vdd_io of the IO interface.

In an embodiment, the source of the transistor PM1 is connected with the internal power supply VDD of a chip, the gate and the drain of the transistor PM1 are shorted together and connected with the gate of the transistor PM2 and the sink current I0; the source of the transistor PM2 is connected with the internal power supply VDD of the chip, the drain of the transistor PM2 is connected with the drain and the gate of the transistor NM3 and the gate of the transistor NM4; the source of the transistor NM3 is connected with that of the PMOS transistor PM0; the gate and the drain of the transistor PM0 and the gate and the drain of the transistor NM0 are connected with the gate of the transistor NM1; the source of the transistor NM0 is connected with the ground potential; the source of the transistor NM1 is connected with the ground potential, the drain of the transistor NM1 is connected with the source of the transistor NM4 and the anode of the output filter capacitor to function as the output electrode of a circuit; and the drain of the transistor NM4 is connected with the internal power supply VDD of the chip.

According to the circuit structure provided in embodiments of the disclosure, the internal power supply VDD of a chip forms a current mirror with a transistor PM1 and a transistor PM2 to provide a bias current for an intermediate level generation unit in which the gate and the drain of a transistor NM0 and the gate and the drain of a transistor PM0 are connected, thus, the potentials of the gate and the drain of the transistor NM0 and the gate and the drain of the transistor PM0 are equal, because the source of the transistor NM0 is connected with the ground potential and the gate of the transistor NM0 is identical to the drain of the transistor NM0 in potential, the potential of the connection point of the drains of the transistor NM0 and the transistor PM0 is $V_{GSNM0}$, where GS represents gate-to-source, and $V_{GSNM0}$ represents the gate-to-source voltage of the transistor NM0;

because the potential of the gate of the transistor PM0 is equal to that of the drain of the transistor PM0, the potential of the drain of the transistor PM0 is $V_{GSNM0}$, thus, the potential of the connection point (a point C) of the sources of the transistor NM3 and the transistor PM0 is the sum of $V_{GSNM0}$ and $V_{GSPM0}$, where $V_{GSPM0}$ represents the gate-to-source voltage of the transistor PM0;

the drain of the transistor NM3, the gate of the transistor NM3 and the gate of the transistor NM4 are connected at a point D, thus, the potentials of the drain of the transistor NM3, the gate of the transistor NM3 and the gate of the transistor NM4 are equal, because the point C is the source of the transistor NM3 and the point D is the gate of the transistor NM3, the potential of the point D is the sum of the potential of the point C and $V_{GSNM3}$, that is, the potential of the point D is the sum of $V_{GSNM0}$, $V_{GSPM0}$ and $V_{GSNM3}$, where $V_{GSNM3}$ is the gate-to-source voltage of the transistor NM3;

because it is set that the current flowing through the transistor NM3 is the same as that flowing through the transistor NM4, $V_{GSNM3}$ is equal to $V_{GSNM4}$; because Vdd_io is the potential of the source of the transistor NM4, the potential of the Vdd_io is the difference between the potential of the point D and $V_{GSNM4}$;

because the potential of the point D is the sum of $V_{GSNM0}$, $V_{GSPM0}$ and $V_{GSNM3}$, the potential of the Vdd_io is $V_{GSNM0}+V_{GSPM0}+V_{GSNM3}-V_{GSNM4}=V_{GSNM0}+V_{GSPM0}$, that is, the potential of the Vdd_io is the sum of a gate-to-source voltage of the transistor NM0 and a gate-to-source voltage of the transistor PM0; because the gate-to-source voltage of an MOS is about 0.7, the potential of the Vdd_io is generally 1.4 or so, and typically, in consideration of floating error, the potential of the Vdd_io is 1.2V-1.4V. This level can ensure the accurate conversion of a signal input to an IO into a level signal in a chip through a succeeding-stage level shift.

The solutions of the disclosure will be described below in detail with reference to specific embodiments when read in conjunction with accompanying drawings. FIG. 1 is a schematic diagram illustrating the structure of a level shift circuit for an IO interface according to an embodiment of the disclosure, as shown in FIG. 1, the level shift circuit for an IO interface provided herein includes an intermediate level generation sub-circuit 11 and a level shift sub-circuit 12.

The intermediate level generation sub-circuit 11 is arranged to provide the intermediate level Vdd_io of an IO interface.

The intermediate level generation sub-circuit includes: a current mirror unit 111 and an intermediate level generation unit 112, herein the current mirror unit 111 is arranged to provide a bias current for the intermediate level generation unit according to a sink current; and the intermediate level generation unit 112 is arranged to provide, under the effect of the bias current, the intermediate level Vdd_io of the IO interface.

In an embodiment, the current mirror unit 111 includes a transistor PM1 and a transistor PM2, herein the grid and the drain of the transistor PM1 are connected with the gate of the transistor PM2 to form a current mirror.

The current mirror is a mirror current source, when the input end of the current mirror inputs a reference current, the output end of the current mirror outputs an output current which is identical in magnitude and direction to the reference current. In this way, the current of an input branch is copied into an output branch to provide a current for another subsystem. The principle of current mirror is that the channel currents of two identical MOSs are equal if the gate-to-source voltages of the two MOSs are equal. For example, in embodiments of the disclosure, the source of the of the transistor PM1 is equal to that of the transistor PM2 in potential, both being VDD; the gate of the transistor PM1 is equal to that of the transistor PM2 in potential, that is, the gate-to-source voltage of the transistor PM1 is equal to that of the transistor PM2, thus, the drain current of the transistor PM1 is equal to that of the transistor PM2 if the transistor PM1 is completely identical to the transistor PM2 in attribute; and the output current of the current mirror unit is equal to the product of K and an input current if attributes of the transistor PM1 are different from those of the transistor PM2, herein K is determined by attributes of the transistor PM1 and the transistor PM2. In this way, the current of the input branch is copied into the output branch.

The intermediate level generation unit 112 includes a transistor PM0, a transistor NM0, a transistor NM1, a transistor NM3 and a transistor NM4, herein the transistor PM0, the transistor NM0, the transistor NM3 and the transistor NM4, which are diode-connected, are arranged to cause the output intermediate level Vdd_io of the IO interface to be equal to the sum of a gate-to-source voltage of the transistor NM0 and a gate-to-source voltage of the transistor PM0.

The transistor NM1 which provides a bias current for the transistor NM4 is arranged to avoid the output intermediate level Vdd_io of the IO interface to be high when empty load of a succeeding stage causes the gate-to-source voltage of the transistor NM4 to be 0.

In embodiments of the disclosure, the transistor NM0 and the transistor NM1 constitute a current mirror structure arranged to input a current which is K times the magnitude of the drain current of the transistor NM0 to the source of the transistor NM4, here, K is determined by attributes of the transistor NM0 and the transistor NM1, and when the transistor NM0 is completely identical to the transistor NM1 in attribute, K is 1, so as to avoid the output intermediate level Vdd_io of the IO interface to be high when empty load of a succeeding stage causes the gate-to-source voltage of the transistor NM4 to be 0.

In embodiments of the disclosure, each of the transistor NM0 to the transistor NM4 is an NMOS transistor, each of the transistor PM0 to the transistor PM2 is a PMOS transistor, alternatively, each of the transistor NM0 to the transistor NM2 is an NMOS transistor, the transistor PM0 is a PMOS transistor, and each of the transistor PM1, the transistor PM2, the transistor NM3 and the transistor NM4 is a high voltage resisting DEMOS transistor.

Here, whether to use ordinary NMOS transistors or high voltage resisting DEMOS transistors as the transistor NM0 to the transistor NM4 and whether to use ordinary PMOS transistors or high voltage resisting DEMOS transistors as the transistor PM0 to the transistor PM2 can be determined according to the magnitude of the internal voltage VDD of a chip. For example, when VDD is 5V, ordinary 5V NMOS transistors are used as the transistor NM0 to the transistor NM4, and ordinary PMOS transistors are used as the transistor PM0 to the transistor PM2; when VDD is 7V, 7V DEMOS transistors resistant to high voltage are used as the transistor NM3 and the transistor NM4 and the transistor PM1 and the transistor PM2; and when the VDD is 18V, 18V DEMOS transistors resistant to high voltage are used as the transistor NM3 and the transistor NM4 and the transistor PM1 and the transistor PM2.

The intermediate level generation sub-circuit further includes: an output filter capacitor C1 arranged to stabilize the output voltage of the level shift circuit for an IO interface, that is, the intermediate level Vdd_io of the IO interface.

In an embodiment, the source of the transistor PM1 is connected with the internal power supply VDD of a chip, the gate and the drain of the transistor PM1 are shorted together and connected with the gate of the transistor PM2 and the sink current I0; the source of the transistor PM2 is connected with the internal power supply VDD of the chip, the drain of the transistor PM2 is connected with the drain and the gate of the transistor NM3 and the gate of the transistor NM4; the source of the transistor NM3 is connected with that of the PMOS transistor PM0; the gate and the drain of the transistor PM0 and the gate and the drain of the transistor NM0 are connected with the gate of the transistor NM1; the source of the transistor NM0 is connected with the ground potential; the source of the transistor NM1 is connected with the ground potential, the drain of the transistor NM1 is connected with the source of the transistor NM4 and the anode of the output filter capacitor to function as the output electrode of a circuit, and the drain of the transistor NM4 is connected with the internal power supply VDD of the chip.

In FIG. 1, the internal power supply VDD of a chip forms a current mirror with a transistor PM1 and a transistor PM2 to provide a bias current for an intermediate level generation unit in which the gate and the drain of a transistor NM0 and the gate and the drain of a transistor PM0 are connected, thus, the potentials of the gate and the drain of the transistor NM0 and those of the transistor PM0 are the same, because the source of the transistor NM0 is connected with the ground potential and the gate of the transistor NM0 is identical to the drain of the transistor NM0 in potential, the potential of the connection point of the drains of the transistor NM0 and the transistor PM0 is $V_{GSNM0}$, herein GS represents gate-to-source, and $V_{GSNM0}$ represents the gate-to-source voltage of the transistor NM0;

because the potential of the gate of the transistor PM0 is equal to that of the drain of the transistor PM0, the potential of the drain of the transistor PM0 is $V_{GSNM0}$, thus, the potential of the connection point (a point C) of the sources of the transistor NM3 and the transistor PM0 is $V_{GSNM0}+V_{GSPM0}$, where $V_{GSPM0}$ represents the gate-to-source voltage of the transistor PM0.

the drain of the transistor NM3, the gate of the transistor NM3 and the gate of the transistor NM4 are connected at a point D, thus, the potential of the drain of the transistor NM3 and those of the gates of the transistor NM3 and the transistor NM4 are equal, because the point C is the source of the transistor NM3 and the point D is the gate of the transistor NM3, the potential of the point D is the sum of the potential of the point C and $V_{GSNM3}$, that is, the potential of the point D is the sum of $V_{GSNM0}$, $V_{GSPM0}$ and $V_{GSNM3}$, where $V_{GSNM3}$ is the gate-to-source voltage of the transistor NM3;

because it is set that the current flowing through the transistor NM3 is the same as that flowing through the transistor NM4, $V_{GSNM3}$ is equal to $V_{GSNM4}$; because Vdd_io is the potential of the source of the transistor NM4, the potential of the Vdd_io is the difference between the potential of the point D and $V_{GSNM4}$;

because the potential of the point D is the sum of $V_{GSNM0}$, $V_{GSPM0}$ and $V_{GSNM3}$, the potential of the Vdd_io is $V_{GSNM0}+V_{GSPM0}+V_{GSNM3}-V_{GSNM4}=V_{GSNM0}+V_{GSPM0}$, that is, the potential of the Vdd_io is the sum of a gate-to-source voltage of the transistor NM0 and a gate-to-source voltage of the transistor PM0; because the gate-to-source voltage of an MOS is about 0.7, the potential of the Vdd_io is generally 1.4 or so, and typically, in consideration of floating error, the potential of the Vdd_io is 1.2V-1.6V. This level can ensure the accurate conversion of a signal input to an IO into a level signal in a chip through a succeeding-stage level shift.

Figure 2:
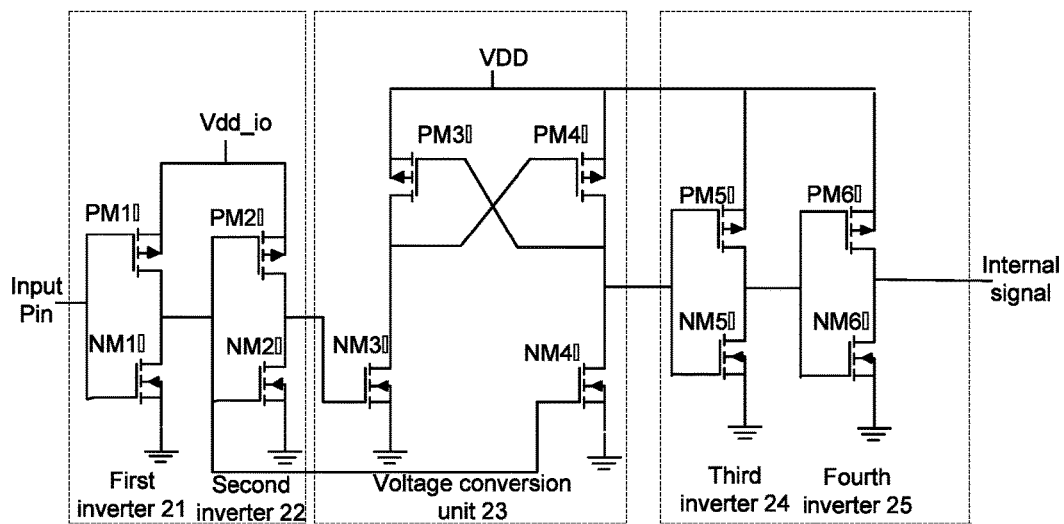
FIG. 2 is a schematic diagram illustrating the structure of a level shift sub-circuit according to an embodiment of the disclosure.

FIG. 2 is a schematic diagram illustrating the structure of a level shift sub-circuit according to an embodiment of the disclosure.

As shown in FIG. 2, the block "level shift" is the level shift sub-circuit that is used to convert an input external level signal into a level signal in a chip according to the intermediate level Vdd_io of an IO interface. As shown in FIG. 2, the voltage shift circuit includes a first inverter 21, a second inverter 22, a voltage conversion unit 23, a third inverter 24 and a fourth inverter 25.

The first inverter 21 and the second inverter 22 are arranged to shape an input signal and increase the drive capability of the input signal.

In embodiments of the disclosure, the first inverter 21 includes a transistor PM1' and a transistor NM1', the second inverter 22 includes a transistor PM2' and a transistor NM2', herein the gates of the transistor PM1' and the transistor NM1' are connected with an external logic signal input end, the source of the transistor PM1' is connected with a Vdd_io, the source of the transistor NM1' is connected with the ground potential, and the drain of the transistor PM1' is connected with that of the transistor NM1' as well as the gates of the transistor PM2' and the transistor NM2' in the second inverter.

The gates of the transistor PM2' and the transistor NM2' are connected with the output end of the first inverter, the source of the transistor PM2' is connected with the Vdd_io, the source of the transistor NM2' is connected with the ground potential, and the drain of the transistor PM2' is connected with that of the transistor NM2' and the gate of a transistor NM3' in the voltage conversion unit.

Because the voltage of the Vdd_io is equal to the sum of the $V_{GSNM0}+V_{GPM0}$, that is, the sum of a gate-to-source voltage of the transistor NM0 and a gate-to-source voltage of the transistor PM0. An external signal entering a level shift input end is first shaped and increased in drive capability by the first and the second inverter. Commonly, the voltage of an external logic signal is 1.8V at least, higher than the Vdd_io (1.2V-1.6V), thus avoiding the electric leakage of a level shift sub-circuit and synchronously guaranteeing that the voltage of VDD_io is enough for driving the first and the second inverter and the transistor NM3' and a transistor NM4'. By taking an external logic signal being 1.8V as an example, the input signal of the first inverter is a high level of 1.8V, the gate voltage of the transistor NM1' is 1.8V, the source of the transistor NM1' is connected with the ground potential, the transistor NM1' is switched on when the gate-to-source voltage of the transistor NM1' is greater than a switch-on voltage threshold; the gate voltage of the transistor PM1' is 1.8V, the source of the transistor PM1' is connected with the Vdd_io, and the transistor PM1' is switched off when the gate-to-source voltage of the transistor PM1' is smaller than the switch-on voltage threshold; when the transistor NM1' is switched on, the drain voltage of the transistor NM1' is equal to the source voltage of the transistor NM1', that is, the output voltage of the first inverter is 0, in other words, the logic of the input signal 1.8V of the first inverter 21 is 1, and under the effect of the inverter, the output logic of the output end of the first inverter 21, that is, the drain of the transistor PM1' and the drain of the transistor NM1', is 0.

Similarly, the logic of the input signal of the second inverter 22 is 0, under the effect of the inverter, the output logic of the output end of the second inverter 22, that is, the drain of the transistor PM2' and that of the transistor NM2', is 1; in an embodiment, in the second inverter 22, the gate voltage of the transistor PM2' is 0, the source voltage of the transistor PM2' is Vdd_io, the transistor PM2' is switched on and the transistor NM2' is switched off when the gate-to-source voltage of the transistor PM2' is greater than a switch-on voltage threshold; if the source voltage of the transistor PM2' is equal to the drain voltage of the transistor PM2', the output voltage of the second inverter 2, that is, the output voltages of the drains of the transistor PM2' and the transistor NM2', is Vdd_io.

The voltage conversion unit 23 is arranged to convert a signal input thereinto into a signal of an internal power domain of a chip.

The voltage conversion unit 23 includes the transistor NM3', the transistor NM4', a PM3' and a PM4', herein the gate voltage of the transistor NM3' is the output signal Vdd_io (1.4V-1.6V) of the second inverter 22, the source of the transistor NM3' is connected with the ground potential, the transistor NM3' is switched on when the gate-to-source voltage of the transistor NM3' is greater than a switch-on voltage threshold, the source voltage of the transistor NM3' is equal to the drain voltage of the transistor NM3', that is, the drain voltage of the transistor NM3' is 0.

The drain of the transistor NM3' is connected with the gate of the PM4', that is, the gate voltage of the PM4' is 0, the gate of the PM4' is connected with the internal power supply VDD of a chip, the PM4' is switched on when the gate-to-source voltage of the PM4' is greater than a switch-on voltage threshold, the drain voltage of the PM4' is equal to the source voltage of the PM4', both equal to the internal power supply VDD of the chip, that is, the output voltage of the voltage conversion unit 23 is the internal power supply VDD of the chip;

The gate of the transistor NM4' in the voltage conversion unit 23 is connected with the output end of the first inverter, the source of the transistor NM4' is connected with the ground potential, the gate voltage of the transistor NM4' is equal to the source voltage of the transistor NM4', and the transistor NM4' is switched off; the source of the PM3' is connected with the internal power supply VDD of the chip, the gate of the PM3' is connected with the drain of the PM4', the gate voltage of the PM3' is equal to the source voltage of the PM3', and the PM3' is switched off.

In conclusion, after an external logic signal passes through the first inverter 21, the second inverter 22 and the voltage conversion unit 23, a signal is output which is the internal power supply VDD of a chip.

The third inverter 24 and the fourth inverter 25, whose working principle is identical to that of the first inverter 21 and the second inverter 22, are arranged to enhance the drive capability of the output signal of a level shift unit.

In this way, a level shift sub-circuit keeps running normally to convert an input external level signal into a level signal in a chip.

The level shift circuit for an IO interface disclosed herein can perform a level shift on the external IO signal of any level in a high voltage resisting domain of a device with the actual level of an external IO not taken into consideration inside a chip, thus addressing the problems existing in level shift and signal driving of an interface circuit without requiring an additional arrangement of a power domain for external IO levels in a circuit; moreover, the level shift circuit for an IO interface disclosed herein is low in power consumption; because the working current of an MOS can be below uA level, the current consumed by the circuit structure provided herein can be below uA level and is therefore suitable to be integrated with a power supply management chip having a strict requirement on power consumption to meet the low power consumption requirement of the power supply management chip; by changing the types of the transistor PM1, the transistor PM2, the transistor NM3 and the transistor NM4 arranged in the intermediate level generation sub-circuit and employing devices suitable for different voltage resisting domains in the level shift sub-circuit, the level of an external IO can be shifted into an internal high-voltage power domain; the circuit provided herein is simple in structure, besides, the circuit provided herein which only uses MOSs and high voltage resisting devices matching with an internal voltage domain of a chip is compatible with the mainstream BCD technology in the absence of an additional mask plate and an additional power generation sub-circuit such as an LDO, thus lowering the cost of a chip.

To adapt to different internal levels of chips, different voltage resisting devices are selectively used as the transistor PM1, the transistor PM2, the transistor NM3 and the transistor NM4 according to the level of a VDD, so that IO levels are shifted into internal levels of chips merely by selecting different voltage resisting devices, thus, the flexibility of level shift is high. Levels such as 1.8V and 5V can be shifted into an internal power domain of a chip.

For example, 1.8V, 2.5V, 3.3V and 5V are the common external interface levels that are used currently, if an external interface level is 1.8V, then the internal power supply VDD is 5V, it is needed to use ordinary standard 5V MOSs as the transistor PM1, transistor PM2, transistor NM3 and transistor NM4, and a common level shift circuit is used in a level shift process to convert an input 1.8V level into a signal of a 5V power domain in a chip. If the external interface level is 5V, then the internal power supply VDD is 18V, it is needed to use DEMOS transistors resistance to a high voltage of 18V as the transistor PM1, transistor PM2, transistor NM3 and transistor NM4, and a high-voltage level shift circuit is used in a level shift process to convert an input 5V level into a signal of a high-voltage 18V power domain in a chip.

Figure 3:
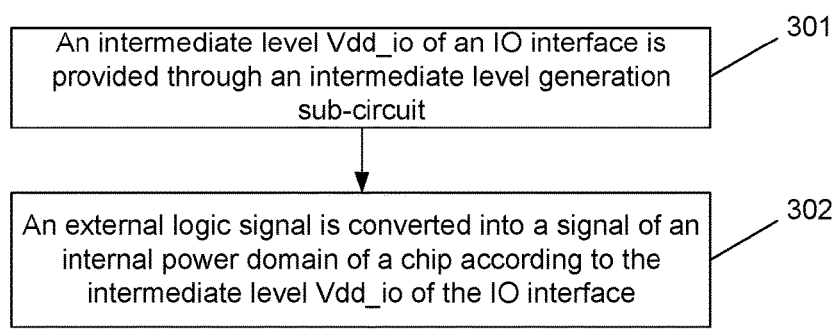
FIG. 3 is a flowchart of a level shift method for an IO interface according to an embodiment of the disclosure.

A level shift method for an IO interface is also provided in an embodiment of the disclosure, FIG. 3 is a flowchart of a level shift method for an IO interface according to an embodiment of the disclosure, and as shown in FIG. 3, the method includes the following steps:

S301: an intermediate level Vdd_io of the IO interface is provided through an intermediate level generation sub-circuit;

In this step, providing the intermediate level Vdd_io of the IO interface through the intermediate level generation sub-circuit includes: providing a bias current for an intermediate level generation unit through a current mirror unit according to a sink current; and providing the intermediate level Vdd_io of the IO interface through the intermediate level generation unit.

In the intermediate level generation sub-circuit, a transistor PM1 is connected with a transistor PM2 to form a current mirror to provide a bias current; a transistor PM0, a transistor NM0, a transistor NM3 and a transistor NM4 are diode-connected to cause the output intermediate level Vdd_io of the IO interface to be equal to the sum of a gate-to-source voltage of the transistor NM0 and a gate-to-source voltage of the transistor PM0.

The method further includes: providing a bias current for the transistor NM4 through the transistor NM1 to avoid the output intermediate level Vdd_io of the IO interface to be high when empty load of a succeeding stage causes the gate-to-source voltage of the transistor NM4 to be 0; and stabilizing the output voltage of the intermediate level generation sub-circuit through an output filter capacitor.

S302: an external logic signal is converted into a signal of an internal power domain of a chip according to the intermediate level Vdd_io of the IO interface.

In an embodiment, an input signal is shaped and increased in drive capability by a first and a second inverter.

A voltage conversion unit converts a signal input thereinto into a signal of an internal power domain of a chip.

The drive capability of the output signal of the level shift unit is increased by a third and a fourth inverter.

In this way, a level shift sub-circuit keeps running normally to convert an input external level signal into a level signal in an internal power domain of a chip.

Accordingly, a computer storage medium is also provided in an embodiment of the disclosure, herein the computer storage medium stores computer-executable instructions that are used to execute the level shift method for an IO interface provided in embodiments of the disclosure.

Although exemplified based on the foregoing embodiments, the level shift circuit for an IO interface, the level shift method for an IO interface and the storage medium disclosed herein are not limited to these embodiments. It should be appreciated by those skilled in the art that the solutions described in the foregoing embodiments can be modified or a part of or all the technical features of the solutions can be substituted with equivalents as long as the modifications or substitutes do not make the essence of corresponding technical solutions depart from the scope of the technical solutions provided herein.

The above is merely preferred embodiments of the disclosure but is not to be construed as limiting the scope of the disclosure.

What is claimed is:

1. A level shift circuit for an IO interface, comprising: an intermediate level generation sub-circuit and a level shift sub-circuit,
   wherein the intermediate level generation sub-circuit is arranged to provide an intermediate level Vdd_io of the IO interface; and
   the level shift sub-circuit is arranged to convert an external logic signal into a signal of an internal power domain of a chip according to the intermediate level Vdd_io of the IO interface, the external logic signal being input through an input pin of the level shift sub-circuit,
   wherein the intermediate level generation sub-circuit comprises: a current mirror unit and an intermediate level generation unit,
   wherein the current mirror unit is arranged to provide a bias current for the intermediate level generation unit according to a sink current I0; and
   the intermediate level generation unit is arranged to provide, under an effect of the bias current, the intermediate level Vdd_io of the IO interface,
   wherein the current mirror unit comprises a transistor PM1 and a transistor PM2, wherein a gate and a drain of the transistor PM1 are connected with a gate of the transistor PM2 to form a current mirror; and
   the intermediate level generation unit comprises a transistor PM0, a transistor NM0, a transistor NM1, a transistor NM3 and a transistor NM4, wherein the transistor PM0, the transistor NM0, the transistor NM3 and the transistor NM4, which are diode-connected, are arranged to cause the intermediate level Vdd_io of the IO interface to be equal to a sum of a gate-to-source voltage of the transistor NM0 and a gate-to-source voltage of the transistor PM0.

2. The level shift circuit for an IO interface according to claim 1, wherein the transistor NM1, which provides a bias current for the transistor NM4, is arranged to avoid the intermediate level Vdd_io of the IO interface being high when empty load of a succeeding stage causes a gate-to-source voltage of the transistor NM4 to be 0.

3. The level shift circuit for an IO interface according to claim 1, wherein each of the transistor NM0, the transistor NM1, the transistor NM3, and the transistor NM4 is an N-Channel Metal Oxide Semiconductor (NMOS) transistor, each of the transistor PM0, the transistor PM1, and the transistor PM2 is a P-Channel Metal Oxide Semiconductor (PMOS) transistor; or, each of the transistor NM0 and the transistor NM1 is an NMOS transistor, the transistor PM0 is a PMOS transistor, and each of the transistor PM1, the transistor PM2, the transistor NM3 and the transistor NM4 is a high voltage resisting Drain Extended Metal Oxide Semiconductor (DEMOS) transistor.

4. The level shift circuit for an IO interface according to claim 1, wherein the intermediate level generation sub-circuit further comprises: an output filter capacitor arranged to stabilize an output voltage of the intermediate level generation sub-circuit.

5. The level shift circuit for an IO interface according to claim 1, wherein a source of the transistor PM1 is connected with an internal power supply VDD of the chip, and the gate and the drain of the transistor PM1 are shorted together and connected with the gate of the transistor PM2 and the sink current I0;
- a source of the transistor PM2 is connected with the internal power supply VDD of the chip, a drain of the transistor PM2 is connected with a drain and a gate of the transistor NM3 and a gate of the transistor NM4;
- a source of the transistor NM3 is connected with a source of the transistor PM0;
- a gate and a drain of the transistor PM0 and a gate and a drain of the transistor NM0 are connected with a gate of the transistor NM1;
- a source of the transistor NM0 is connected with a ground potential;
- a source of the transistor NM1 is connected with the ground potential, a drain of the transistor NM1 is connected with a source of the transistor NM4 and an anode of an output filter capacitor to function as an output of the intermediate level generation sub-circuit; and
- a drain of the transistor NM4 is connected with the internal power supply VDD of the chip.

6. The level shift circuit for an IO interface according to claim 2, wherein a source of the transistor PM1 is connected with an internal power supply VDD of the chip, and the gate and the drain of the transistor PM1 are shorted together and connected with the gate of the transistor PM2 and the sink current I0;
- a source of the transistor PM2 is connected with the internal power supply VDD of the chip, a drain of the transistor PM2 is connected with a drain and a gate of the transistor NM3 and a gate of the transistor NM4;
- a source of the transistor NM3 is connected with a source of the transistor PM0;
- a gate and a drain of the transistor PM0 and a gate and a drain of the transistor NM0 are connected with a gate of the transistor NM1;
- a source of the transistor NM0 is connected with a ground potential;
- a source of the transistor NM1 is connected with the ground potential, a drain of the transistor NM1 is connected with a source of the transistor NM4 and an anode of an output filter capacitor to function as an output of the intermediate level generation sub-circuit; and
- a drain of the transistor NM4 is connected with the internal power supply VDD of the chip.

7. The level shift circuit for an IO interface according to claim 3, wherein a source of the transistor PM1 is connected with an internal power supply VDD of the chip, and the gate and the drain of the transistor PM1 are shorted together and connected with the gate of the transistor PM2 and the sink current I0;
- a source of the transistor PM2 is connected with the internal power supply VDD of the chip, a drain of the transistor PM2 is connected with a drain and a gate of the transistor NM3 and a gate of the transistor NM4;
- a source of the transistor NM3 is connected with a source of the transistor PM0;
- a gate and a drain of the transistor PM0 and a gate and a drain of the transistor NM0 are connected with a gate of the transistor NM1;
- a source of the transistor NM0 is connected with a ground potential;
- a source of the transistor NM1 is connected with the ground potential, a drain of the transistor NM1 is connected with a source of the transistor NM4 and an anode of an output filter capacitor to function as an output of the intermediate level generation sub-circuit; and
- a drain of the transistor NM4 is connected with the internal power supply VDD of the chip.

8. A level shift method for an IO interface, comprising:
providing, by an intermediate level generation sub-circuit, an intermediate level Vdd_io of the IO interface; and
converting, by a level shift sub-circuit, an external logic signal into a signal of an internal power domain of a chip according to the intermediate level Vdd_io of the IO interface, the external logic signal being input through an input pin of the level shift sub-circuit,
wherein providing, by the intermediate level generation sub-circuit, the intermediate level Vdd_io of the IO interface comprises: providing a bias current for an intermediate level generation unit of the intermediate level generation sub-circuit through a current mirror unit of the intermediate level generation sub-circuit according to a sink current; and providing the intermediate level Vdd_io of the IO interface through the intermediate level generation unit,
wherein providing the intermediate level Vdd_io of the IO interface through the intermediate level generation unit comprises: diode-connecting a transistor PM0, a transistor NM0, a transistor NM3 and a transistor NM4 to cause the intermediate level Vdd_io of the IO interface to be equal to a sum of a gate-to-source voltage of the transistor NM0 and a gate-to-source voltage of the transistor PM0;
the method further comprises: providing a bias current for the transistor NM4 through a transistor NM1 of the intermediate level generation unit to avoid the intermediate level Vdd_io of the IO interface to be high when empty load of a succeeding stage causes a gate-to-source voltage of the transistor NM4 to be 0; and
stabilizing an output voltage of the intermediate level generation sub-circuit through an output filter capacitor.

9. A non-transitory computer storage medium having stored therein computer-executable instructions arranged to execute a level shift method for an IO interface, the method comprising:
providing, by an intermediate level generation sub-circuit, an intermediate level Vdd_io of the IO interface; and
converting, by a level shift sub-circuit, an external logic signal into a signal of an internal power domain of a chip according to the intermediate level Vdd_io of the IO interface, the external logic signal being input through an input pin of the level shift sub-circuit,
wherein providing, by the intermediate level generation sub-circuit, the intermediate level Vdd_io of the IO interface comprises: providing a bias current for an intermediate level generation unit of the intermediate level generation sub-circuit through a current mirror unit of the intermediate level generation sub-circuit according to a sink current; and providing the intermediate level Vdd_io of the IO interface through the intermediate level generation unit, wherein providing the intermediate level Vdd_io of the IO interface through the intermediate level generation unit comprises: diode-connecting a transistor PM0, a transistor NM0, a transistor NM3 and a transistor NM4 to cause the intermediate level Vdd_io of the IO interface to be equal to a sum of a gate-to-source voltage of the transistor NM0 and a gate-to-source voltage of the transistor PM0;

the method further comprises: providing a bias current for the transistor NM4 through a transistor NM1 of the intermediate level generation unit to avoid the intermediate level Vdd_io of the IO interface to be high when empty load of a succeeding stage causes a gate-to-source voltage of the transistor NM4 to be 0; and stabilizing an output voltage of the intermediate level generation sub-circuit through an output filter capacitor.

* * * * *